United States Patent
Hsu et al.

(10) Patent No.: US 10,326,049 B1
(45) Date of Patent: Jun. 18, 2019

(54) UV LIGHT-EMITTING DIODE

(71) Applicant: EPILEDS TECHNOLOGIES, INC., Tainan (TW)

(72) Inventors: Kung-Hsieh Hsu, Tainan (TW); Ming-Sen Hsu, Tainan (TW)

(73) Assignee: Epileds Technologies, Inc., Tainan (TW)

( * ) Notice: Subject to any disclaimer, the term of this patent is extended or adjusted under 35 U.S.C. 154(b) by 0 days.

(21) Appl. No.: 16/055,584

(22) Filed: Aug. 6, 2018

(30) Foreign Application Priority Data

Jan. 9, 2018 (TW) .............................. 107200371 U

(51) Int. Cl.
- *H01L 27/15* (2006.01)
- *H01L 33/06* (2010.01)
- *H01L 33/14* (2010.01)
- *H01L 33/32* (2010.01)

(52) U.S. Cl.
CPC ............ *H01L 33/06* (2013.01); *H01L 33/145* (2013.01); *H01L 33/32* (2013.01)

(58) Field of Classification Search
CPC ...................................................... H01L 33/06
USPC ............................................................ 257/79
See application file for complete search history.

(56) References Cited

U.S. PATENT DOCUMENTS

| | | | | |
|---|---|---|---|---|
| 2013/0292687 A1* | 11/2013 | Jiang | ................ | H01L 31/03048 257/76 |
| 2014/0070372 A1* | 3/2014 | Yoon | .................. | H01L 21/0254 257/615 |
| 2015/0372190 A1* | 12/2015 | Hirayama | ............... | H01L 33/32 257/99 |
| 2017/0309785 A1* | 10/2017 | Watanabe | ............. | H01L 33/007 |

FOREIGN PATENT DOCUMENTS

CN        102623599 A  *  8/2012

* cited by examiner

*Primary Examiner* — Ajay Arora
(74) *Attorney, Agent, or Firm* — Muncy, Geissler, Olds & Lowe, P.C.

(57) ABSTRACT

An UV light-emitting diode includes a patterned substrate, a template layer, a growth layer, a first n-type semiconductor layer, an intrinsic semiconductor layer, a second n-type semiconductor layer, a plurality of layers of multiple quantum wells, a barrier layer, a first electron blocking layer, a second electron blocking layer, a first p-type semiconductor layer and a second p-type semiconductor layer in sequence from a bottom layer to a top layer. Whereas the aforementioned layers all include Group III nitride materials and the number of layers for the plurality of layers of multiple quantum wells is at least five layers. Because the first n-type semiconductor layer, the first p-type semiconductor layer, and the plurality of layers of multiple quantum wells all contain aluminum, short-wavelength UV light is emitted when a current is applied.

10 Claims, 6 Drawing Sheets

UV LIGHT-EMITTING DIODE

CROSS-REFERENCE TO RELATED APPLICATION

This application claims priority from Taiwan Patent Application No. 107200371, filed on Jan. 9, 2018, in Taiwan Intellectual Property Office, the contents of which are hereby incorporated by reference in their entirety for all purposes.

BACKGROUND OF THE INVENTION

Field of the Invention

The present invention relates to a light-emitting element, and more particularly to an UV (Ultra Violet) light-emitting diode which emits light in the UV wavelength region.

Description of Related Art

Recently, with the rise of environmental awareness and the enforcement of the treaty banning mercury lamps, it is imperative to develop other light sources that can replace mercury lamps, wherein, a UV light-emitting diode which replaces the UV light mercury lamps are highly expected. However, the luminous efficiency of UV light-emitting diodes is actually not as high as imagined. Scholars and manufacturers are constantly researching how to enhance the luminous efficiency of UV light-emitting diodes. Until now, the best solution to this problem was still being sought.

In view of the foregoing, the inventors of the present invention considered and designed an UV light-emitting diode in the hope of ameliorating the absence of the prior art and further enhancing its industrial applications.

SUMMARY OF THE INVENTION

In view of the above-mentioned drawbacks of the prior art, the primary object of the present disclosure is to provide an UV light-emitting diode that solves the problems encountered in the prior art.

To achieve the above objectives, the present invention provides an UV light-emitting diode includes a patterned substrate, a template layer, a growth layer, a first n-type semiconductor layer, an intrinsic semiconductor layer, a second n-type semiconductor layer, a plurality of layers of multiple quantum wells, a barrier layer, a first electron blocking layer, a second electron blocking layer, a first p-type semiconductor layer and a second p-type semiconductor layer in sequence from a bottom layer to a top layer. Wherein the template layer includes aluminum nitride; the growth layer includes aluminum indium gallium nitride; the first n-type semiconductor layer includes n-type aluminum gallium nitride; the intrinsic semiconductor layer includes i-type aluminum gallium nitride; the second n-type semiconductor layer includes n-type aluminum gallium nitride; the plurality of layers of multiple quantum wells include n-type aluminum gallium nitride; the barrier layer includes i-type aluminum gallium nitride; the second electron blocking layer includes aluminum gallium nitride and a plurality of layers of multiple quantum barriers; the first p-type semiconductor layer includes aluminum gallium nitride. Due to the aluminum content between the foregoing layers not being uniform, a lattice mismatch between the layers is caused. The patterned substrate does indeed improve the stress between the patterned substrate and the template layer, indirectly improving the stress on the stacked layer above the template layer, thereby reducing lattice dislocations and lattice defects.

Optionally, the patterned substrate is a sapphire substrate.

Optionally, the number of layers for the plurality of layers of multiple quantum wells is at least five layers.

Optionally, each of the plurality of layers of multiple quantum wells includes a well layer and a barrier layer. The barrier layer has greater aluminum content than the well layer.

Optionally, the first n-type semiconductor layer has a different aluminum content from the second n-type semiconductor layer.

Optionally, the first electron blocking layer includes a p-type aluminum nitride layer and a p-type aluminum gallium nitride layer.

Optionally, the p-type aluminum nitride layer and the p-type aluminum gallium nitride layer are a superlattice structure.

Optionally, the number of layers for the plurality of layers of multiple quantum barriers is five layers.

Optionally, each of the plurality of layers of multiple quantum barriers includes a first well layer and a first barrier layer. The first barrier layer has greater aluminum content than the first well layer.

Optionally, the second p-type semiconductor layer includes a p-type gallium nitride layer and a p-type indium gallium nitride layer.

In the light of the above, according to the present invention it may have one or more of the following advantages:

1. The UV light-emitting diode of the present invention utilizes the patterned substrate to reduce the stress between the patterned substrate and the template layer, thereby reducing lattice dislocations and lattice defects and increasing the number of layers that can be stacked in the plurality of layers of multiple quantum wells.

2. The UV light-emitting diode of the present invention utilizes the intrinsic semiconductor layer to reduce the electron moving velocity and is matched with the first electron blocking layer and the second electron blocking layer such that electrons are confined between the multiple quantum wells and recombined with the holes, so as to increase luminous efficiency.

With these and other objects, advantages, and features of the invention that may become hereinafter apparent, the nature of the invention may be more clearly understood by reference to the detailed description of the invention, the embodiments and to the several drawings herein.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DESCRIPTION OF THE PREFERRED EMBODIMENTS

Exemplary embodiments of the present invention are described herein in the context of an UV light-emitting diode.

Those of ordinary skilled in the art will realize that the following detailed description of the exemplary embodiment (s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

Figure 1:
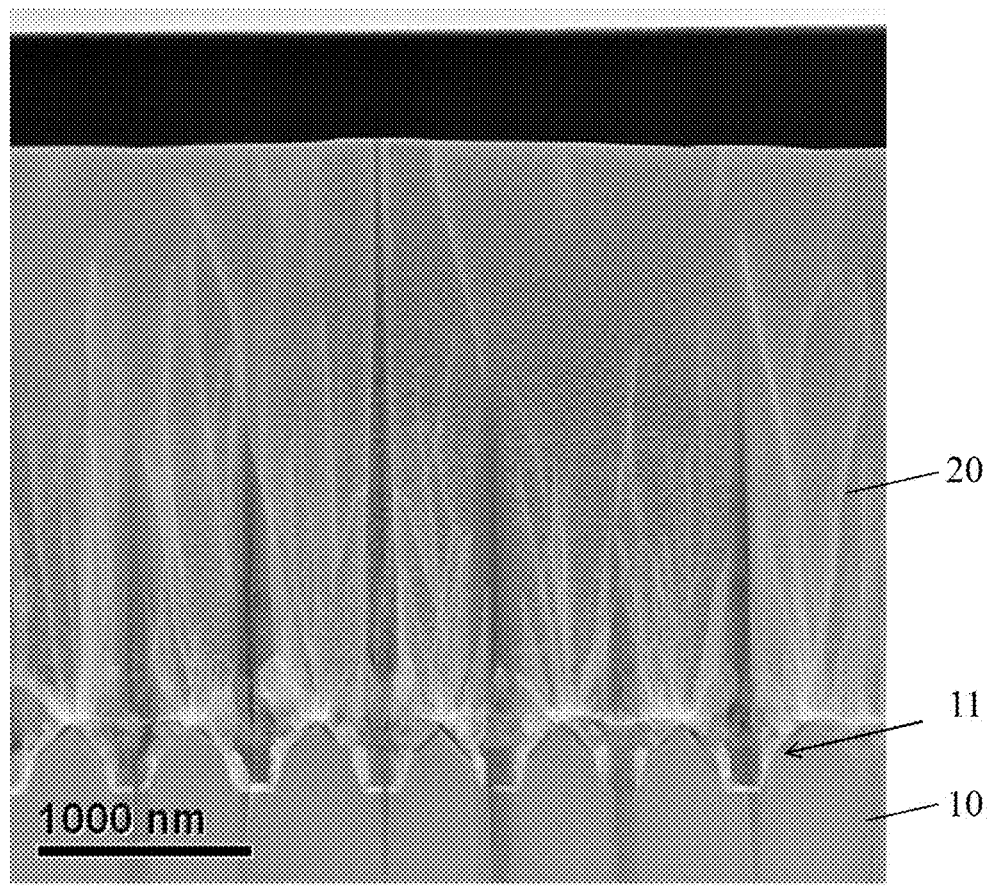
FIG. 1 is a patterned substrate view of a first embodiment of an UV light-emitting diode of the present invention.

Herein, the stacking relationship between a patterned substrate 10 and a template layer 20 will be described first, and it will be described with reference to FIG. 1, which is a patterned substrate view of a first embodiment of an UV light-emitting diode of the present invention. Wherein, as shown in the figure, it is learned that the patterned substrate 10 has a plurality of grooves 11 that periodically arranged, and the template layer 20 is gradually deposited from the plurality of grooves 11 to form a film. Compared with the generally flat substrate, the stress between the patterned substrate 10 and the template layer 20 can be reduced, so as to reduce lattice defects and lattice dislocations, so that the deposition after the template layer 20 is smoother.

In addition, the cross-sectional shape of the plurality of grooves 11 is not a regular groove, but the grooves 11 with an inclined surface, which have a varying inclination angle. The arrangement of such grooves 11 is more compatible with the deposition of the template layer 20, thereby reducing the lattice mismatch rate. Preferably, the pitch of each groove 11 is in a range from about 0.5 to 5 μm, the bottom width of each groove 11 is in a range from about 0.1 μm to 4.5 μm, the top width of each groove 11 is in a range from about 0.5 μm to 5 μm. The inclined plane is a two-layered inclined plane, the inclination angle of the inclined plane near the bottom of the grooves 11 is in a range from about 75 degrees to 90 degrees, and the inclination angle of the inclined plane near the top of the grooves 11 is in a range from about 30 degrees to 90 degrees.

Figure 2:
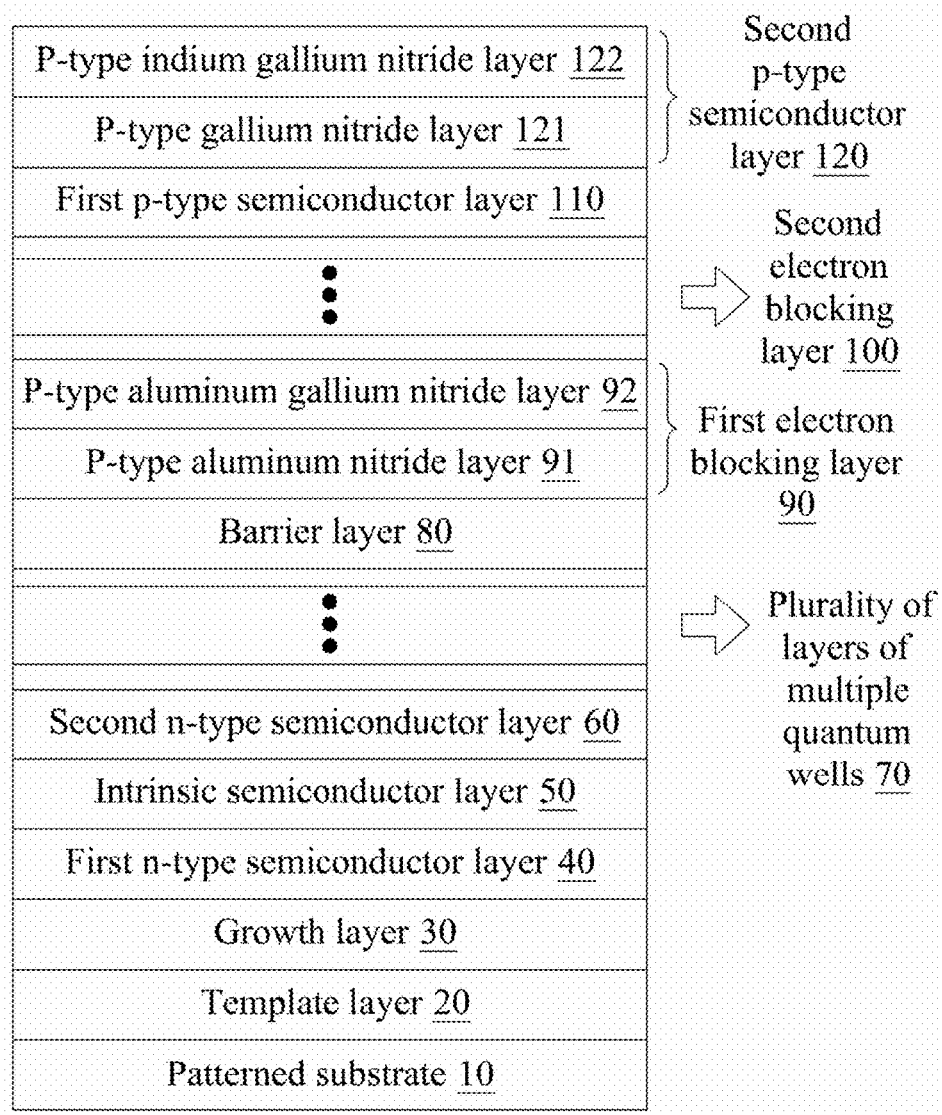
FIG. 2 is a structure view of a first embodiment of an UV light-emitting diode of the present invention.
Figure 3:
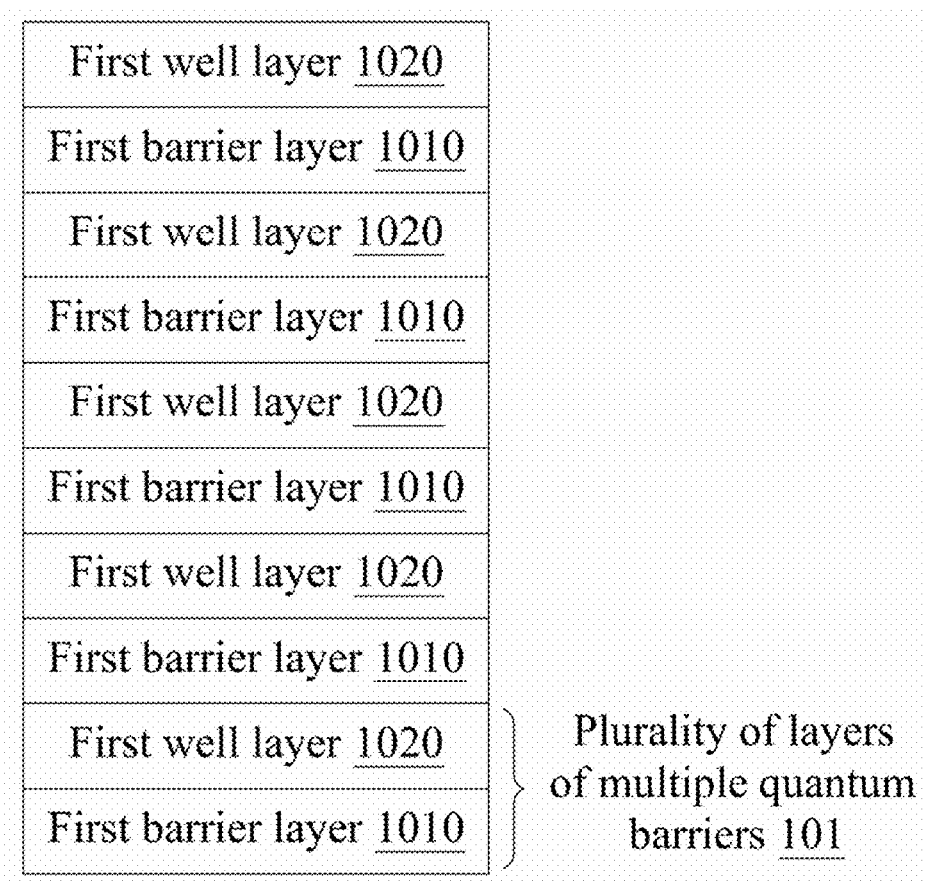
FIG. 3 is a structure view of a second electron blocking layer of a first embodiment of an UV light-emitting diode of the present invention.

As shown in FIG. 2 and FIG. 3, which are a structure view of a first embodiment of an UV light-emitting diode of the present invention and a structure view of a second electron blocking layer of a first embodiment of an UV light-emitting diode of the present invention, respectively. In this embodiment, the UV light-emitting diode includes a patterned substrate 10, a template layer 20, a growth layer 30, a first n-type semiconductor layer 40, an intrinsic semiconductor layer 50, a second n-type semiconductor layer 60, a plurality of layers of multiple quantum wells 70, a barrier layer 80, a first electron blocking layer 90, a second electron blocking layer 100, a first p-type semiconductor layer 110 and a second p-type semiconductor layer 120 in sequence from a bottom layer to a top layer. Wherein the patterned substrate 10 is a sapphire substrate; the template layer 20 includes aluminum nitride; the growth layer 30 includes aluminum indium gallium nitride; the first n-type semiconductor layer 40 includes n-type aluminum gallium nitride; the intrinsic semiconductor layer 50 includes i-type aluminum gallium nitride; the second n-type semiconductor layer 60 includes n-type aluminum gallium nitride; the first n-type semiconductor layer 40 has a different aluminum content from the second n-type semiconductor layer 60; the plurality of layers of multiple quantum wells 70 include n-type aluminum gallium nitride; the barrier layer 80 includes i-type aluminum gallium nitride; the first electron blocking layer 90 includes a p-type aluminum nitride layer 91 and a p-type aluminum gallium nitride layer 92; the second electron blocking layer 100 includes aluminum gallium nitride and a plurality of layers of multiple quantum barriers 101; the first p-type semiconductor layer 110 includes aluminum gallium nitride; the second p-type semiconductor layer 120 includes a p-type gallium nitride layer 121 and a p-type indium gallium nitride layer 122. Due to the aluminum content between the foregoing layers not being uniform, the lattice mismatch between the layers is caused. The patterned substrate 10 does indeed improve the stress between the patterned substrate 10 and the template layer 20, indirectly improving the stress on the stacked layer above the template layer 20, thereby reducing lattice dislocations and lattice defects, and the first n-type semiconductor layer 40 may include double n-type aluminum gallium nitride, and the aluminum compositions of the two layers are different from each other.

In addition, the p-type aluminum nitride layer 91 and the p-type aluminum gallium nitride layer 92 are a superlattice structure, so that the p-type aluminum nitride layer 91 and the p-type aluminum gallium nitride layer 92 are periodically grown with both the electronic limitation effect and the hole injection efficiency.

It is worth mentioning that the second electron blocking layer 100 is preferably composed of five layers of multiple quantum barriers 101, each layer of multiple quantum barriers 101 comprises a first well layer 1020 and a first barrier layer 1010, and the first barrier layer 1010 has greater aluminum content than the first well layer 1020. For example, the first barrier layer 1010 includes $Al_{0.8}GaN$, and the first well layer 1020 includes $Al_{0.5}GaN$. However, the aluminum content can also be other numerical values and is not limited to the scope of the present invention. Due to the difference of the aluminum content, the energy level of the second electron blocking layer 100 fluctuates, and the outflow of the high-energy electrons from the plurality of layers of multiple quantum wells 70 is prevented and the electron injection efficiency is improved compared with that of the single electron blocking layer. And the second electron blocking layer 100 matches with the first electron blocking layer 90 and the intrinsic semiconductor layer 50 to confine the electrons to the multiple quantum wells 70 improving the recombination probability of the electrons and the holes, and improving the leakage current, so as to improve the quantum efficiency and improve the light-emitting intensity.

The p-type electrode and the n-type electrode are disposed by etching. The p-type electrode is disposed on the second p-type semiconductor layer 120. The n-type electrode is disposed between the first n-type semiconductor layer 40 and the intrinsic semiconductor layer 50. When current is applied to the present invention, the electrons and the holes recombine in the plurality of layers of multiple quantum wells 70, thereby emitting UV light.

Figure 4:
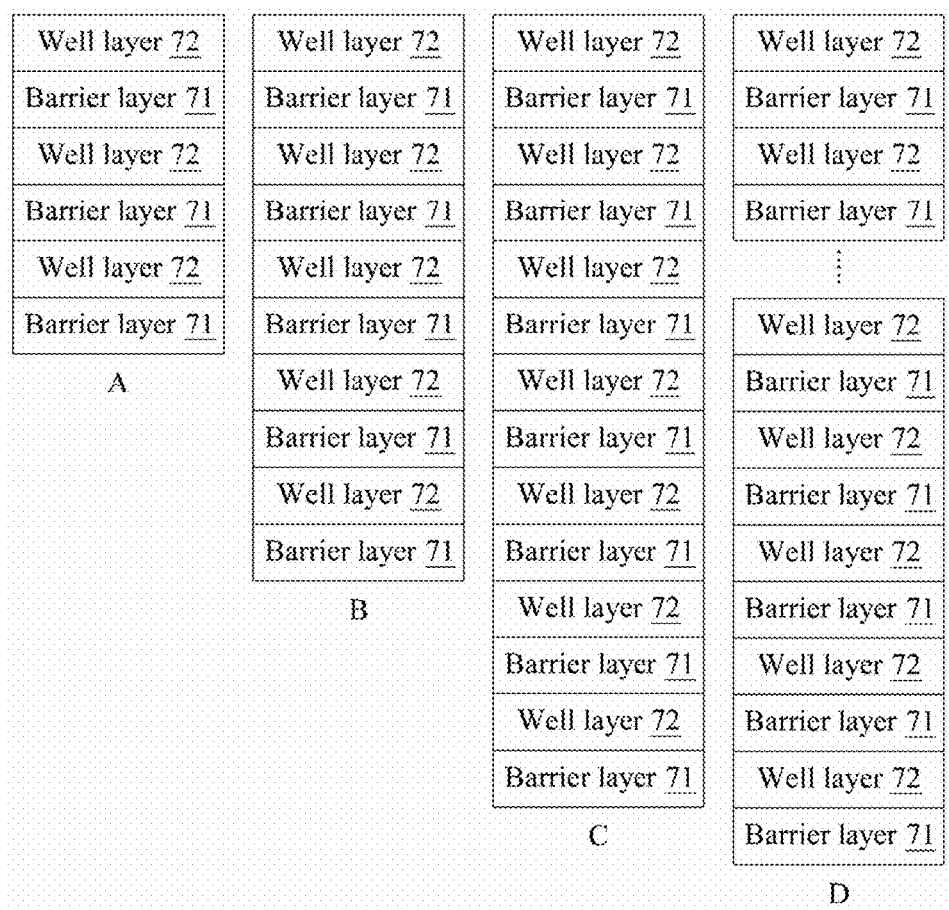
FIG. 4 is a structure view of multiple quantum wells of a second embodiment of an UV light-emitting diode of the present invention.
Figure 5:
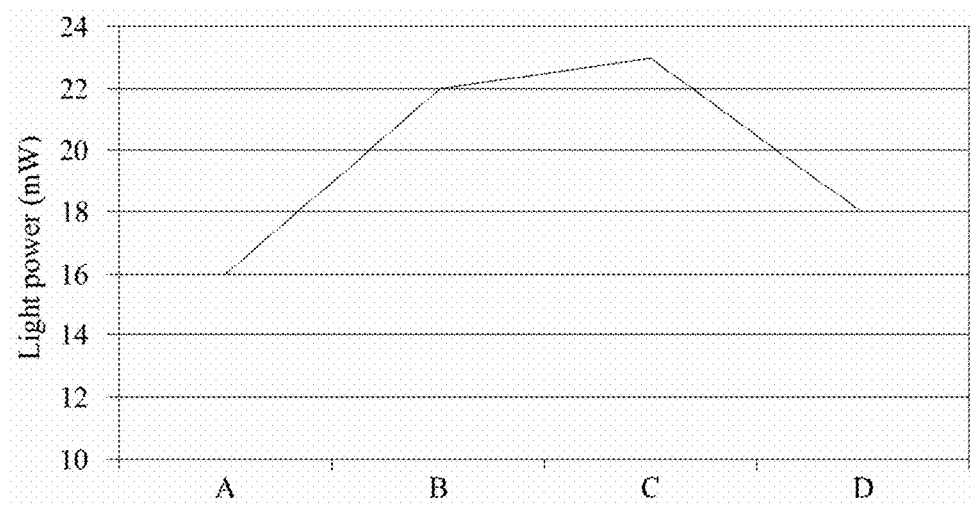
FIG. 5 is a light power diagram of a second embodiment of an UV light-emitting diode of the present invention.
Figure 6:
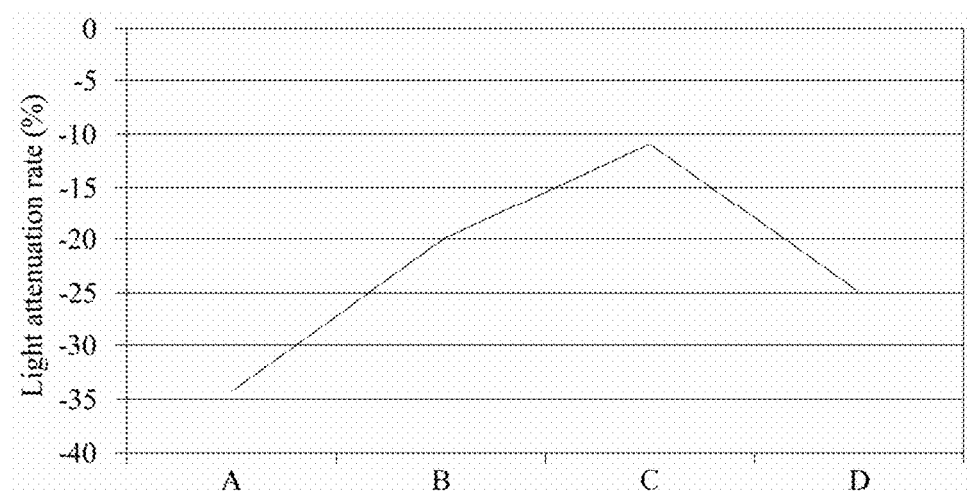
FIG. 6 is a light attenuation rate diagram of a second embodiment of an UV light-emitting diode of the present invention.

Please refer to FIG. 4, FIG. 5 and FIG. 6, which are respectively a structure view of multiple quantum wells of a second embodiment of an UV light-emitting diode of the present invention, a light power diagram of a second embodiment of an UV light-emitting diode of the present invention and a light attenuation rate diagram of a second embodiment of an UV light-emitting diode of the present invention. In the present embodiment, the components of the same reference numbers and their configurations are similar to those described above, and the similarities will be omitted here.

The number of layers for the plurality of layers of multiple quantum wells 70 is at least five layers. Each layer of multiple quantum wells 70 includes a well layer 72 and a barrier layer 71. The barrier layer 71 has greater aluminum content than the well layer 72. For example, the barrier layer 71 includes AlGaN, and the well layer 72 includes $Al_{0.8}GaN$. As shown in FIG. 4, only the number of layers of the multiple quantum wells 70 has changed while the parameters of other layers have not changed, and four samples are taken, which are sample A, sample B, sample C and sample D respectively. Refer to Table 1, FIG. 5 and FIG. 6 to describe:

TABLE 1

| sample | A | B | C | D |
|---|---|---|---|---|
| the number of layers | 3 | 5 | 8 | 10 |
| power (mW) | 16 | 22 | 23 | 18 |
| light attenuation rate (%) | −34 | −20 | −11 | −25 |
| light-emitting wavelength (nm) | 275 | 275 | 275 | 275 |

As can be seen from Table 1, FIG. 5 and FIG. 6, both sample A, sample B, sample C and sample D emit light with a light-emitting intensity higher than 10 mW, and the light-emitting wavelength band is located at the UV wavelength, which is a relatively high power UV light-emitting diode. Therefore, the light source of the present invention can be applied to spectral measurements. There is no significant difference between the light power values of sample B and sample C, and it is learned that when the number of layers of multiple quantum wells 70 is five to eight layers, the light-emitting intensity is saturated. When the number of layers of multiple quantum wells 70 is three or ten layers, the light-emitting intensity is relatively weak. In addition, for light attenuation, sample C has the lowest light attenuation. On the above conditions, it is learned that the sample C should be the best setting conditions for the present invention, and the sample C can be used in medical sterilization.

In summary, the UV light-emitting diode of the present invention reduces the stress between the patterned substrate 10 and the template layer 20 through the patterned substrate 10 to reduce the occurrence of lattice defects and lattice dislocations. Due to the reduced stress, the number of stacked layers of multiple quantum wells 70 is increased. In addition, the first electron blocking layer 90, the second electron blocking layer 100 and the intrinsic semiconductor layer 50 confines the electrons to the multiple quantum wells 70 to improve the electron injection efficiency, so as to improve the light-emitting intensity and optimize the light attenuation. Moreover, since the light-emitting wavelength of the present invention is located at the UV wavelength region, the present invention can replace the mercury lamp. In short, the UV light-emitting diode of the present invention has the advantages as mentioned above, and emits high-intensity ultraviolet light, which can be applied to the lamp or sterilization medical treatment.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. An UV light-emitting diode, comprising:
    a patterned substrate;
    a template layer comprising aluminum nitride (AlN) and disposed on the patterned substrate;
    a growth layer comprising aluminum indium gallium nitride (InAlGaN) and disposed on the template layer;
    a first n-type semiconductor layer comprising n-type aluminum gallium nitride (AlGaN) and disposed on the growth layer;
    an intrinsic semiconductor layer comprising i-type aluminum gallium nitride and disposed on the first n-type semiconductor layer;
    a second n-type semiconductor layer comprising n-type aluminum gallium nitride and disposed on the intrinsic semiconductor layer;
    a plurality of layers of multiple quantum wells comprising n-type aluminum gallium nitride and disposed on the second n-type semiconductor layer;
    a barrier layer comprising i-type aluminum gallium nitride and disposed on the plurality of layers of multiple quantum wells;
    a first electron blocking layer disposed on the barrier layer;
    a second electron blocking layer comprising aluminum gallium nitride and a plurality of layers of multiple quantum barriers, and disposed on the first electron blocking layer;
    a first p-type semiconductor layer comprising aluminum gallium nitride and disposed on the second electron blocking layer; and
    a second p-type semiconductor layer disposed on the first p-type semiconductor layer.

2. The UV light-emitting diode as claimed in claim 1, wherein the patterned substrate is a sapphire substrate.

3. The UV light-emitting diode as claimed in claim 1, wherein the number of layers for the plurality of layers of multiple quantum wells is at least five layers.

4. The UV light-emitting diode as claimed in claim 1, wherein each of the plurality of layers of multiple quantum wells comprises a well layer and a barrier layer, the barrier layer has greater aluminum content than the well layer.

5. The UV light-emitting diode as claimed in claim 1, wherein the first n-type semiconductor layer has a different aluminum content from the second n-type semiconductor layer.

6. The UV light-emitting diode as claimed in claim 1, wherein the first electron blocking layer comprises a p-type aluminum nitride layer and a p-type aluminum gallium nitride layer.

7. The UV light-emitting diode as claimed in claim 6, wherein the p-type aluminum nitride layer and the p-type aluminum gallium nitride layer are a superlattice structure.

8. The UV light-emitting diode as claimed in claim 1, wherein the number of layers for the plurality of layers of multiple quantum barriers is five layers.

9. The UV light-emitting diode as claimed in claim 1, wherein each of the plurality of layers of multiple quantum barriers comprises a first well layer and a first barrier layer, the first barrier layer has greater aluminum content than the first well layer.

10. The UV light-emitting diode as claimed in claim 1, wherein the second p-type semiconductor layer comprises a p-type gallium nitride layer and a p-type indium gallium nitride layer.

\* \* \* \* \*